(12) United States Patent
Holzmann et al.

(10) Patent No.: US 8,917,143 B2
(45) Date of Patent: Dec. 23, 2014

(54) METHOD AND APPARATUS FOR FILTER-LESS ANALOG INPUT CLASS D AUDIO AMPLIFIER CLIPPING

(71) Applicant: Nuvoton Technology Corporation, Hsinchu (TW)

(72) Inventors: Peter J Holzmann, San Jose, CA (US); Zhiqiang Pan, San Jose, CA (US); Yao-Ching Liu, Cupertino, CA (US)

(73) Assignee: Nuvoton Technology Corporation, Hsin-chu (TW)

( * ) Notice: Subject to any disclaimer, the term of this patent is extended or adjusted under 35 U.S.C. 154(b) by 65 days.

(21) Appl. No.: 13/672,641

(22) Filed: Nov. 8, 2012

(65) Prior Publication Data

US 2014/0125411 A1  May 8, 2014

(51) Int. Cl.
 *H03F 3/217* (2006.01)
(52) U.S. Cl.
 CPC ..................................... *H03F 3/217* (2013.01)
 USPC ............................................ 330/251; 330/10
(58) Field of Classification Search
 CPC . H03F 3/217; H03F 3/2173; H03F 2200/351; H03F 2200/331; H03F 3/195; H03F 2200/171; H03F 2200/414; H03F 2200/417; H03F 2200/66; H03F 3/187; H03F 2200/432; H03F 2200/33; H03F 2200/348; H03F 3/2171; H03F 2200/03; H03F 2200/78; H03F 2200/384
 USPC ......................................... 330/10, 207 A, 251
 See application file for complete search history.

(56) References Cited

U.S. PATENT DOCUMENTS

| | | | | |
|---|---|---|---|---|
| 7,142,050 B2 * | 11/2006 | Risbo | ............................. | 330/251 |
| 7,315,202 B2 * | 1/2008 | Tsuji | ............................. | 330/251 |
| 7,425,864 B2 * | 9/2008 | Risbo | ............................. | 330/251 |
| 8,502,602 B2 * | 8/2013 | Hirano et al. | ................. | 330/251 |

* cited by examiner

*Primary Examiner* — Khanh V Nguyen
(74) *Attorney, Agent, or Firm* — Kilpatrick Townsend and Stockton LLP (57) ABSTRACT

An integrated circuit (IC) chip has a class D PWM (pulse width modulation) amplifier configured for generating first and second PWM signals. The class-D PWM modulator includes a differential output driver configured for driving a first and a second output signals in response to the first and the second PWM signals. A clipping detection circuit is configured to turn on a clipping indication signal when one or both of the first PWM signal and the second PWM signal maintain the same state between two consecutive edges of the oscillator clock signal. The clipping detection circuit is also configured to turn off the clipping indication signal when both the first PWM signal and the second PWM signal change states between two consecutive edges of the oscillator clock signal.

16 Claims, 6 Drawing Sheets

METHOD AND APPARATUS FOR FILTER-LESS ANALOG INPUT CLASS D AUDIO AMPLIFIER CLIPPING

CROSS-REFERENCES TO RELATED APPLICATIONS

This application is related to U.S. Pat. No. 5,453,716, issued Sep. 26, 2012, to Andrews et al., which is incorporated herein by reference.

TECHNICAL FIELD

The present invention generally relates to audio systems. More particularly, the present invention relates to methods and systems for audio signal clip detection in a class-D amplifier.

BACKGROUND OF THE INVENTION

A class-D amplifier, sometimes known as a switching amplifier, is an electronic amplifier in which all transistors operate as binary switches. They are either fully on or fully off CLASS-D amplifiers employ rail-to-rail output switching, where ideally their output transistors virtually always carry either zero current or zero voltage. Thus, their power dissipation is minimal, and they provide high efficiency over a wide range of power levels. Their advantageous high efficiency has propelled their use in various audio applications, from cell phones to flat screen televisions and home theater receivers. Class-D audio power amplifiers are more efficient than class-AB audio power amplifiers. Because of their greater efficiency, class-D amplifiers require smaller power supplies and eliminate heat sinks, significantly reducing overall system costs, size, and weight.

Class D audio power amplifiers convert audio signals into high-frequency pulses that switch the output in accordance with the audio input signal. Some class D amplifier use pulse width modulators (PWM) to generate a series of conditioning pulses that vary in width with the audio signal's amplitude. The varying-width pulses switch the power-output transistors at a fixed frequency. Other class D amplifiers may rely upon other types of pulse modulators. The following discussion will mainly refer to pulse width modulators, but those skilled in the art will recognize that class D amplifiers may be configured with other types of modulators.

Figure 1A:
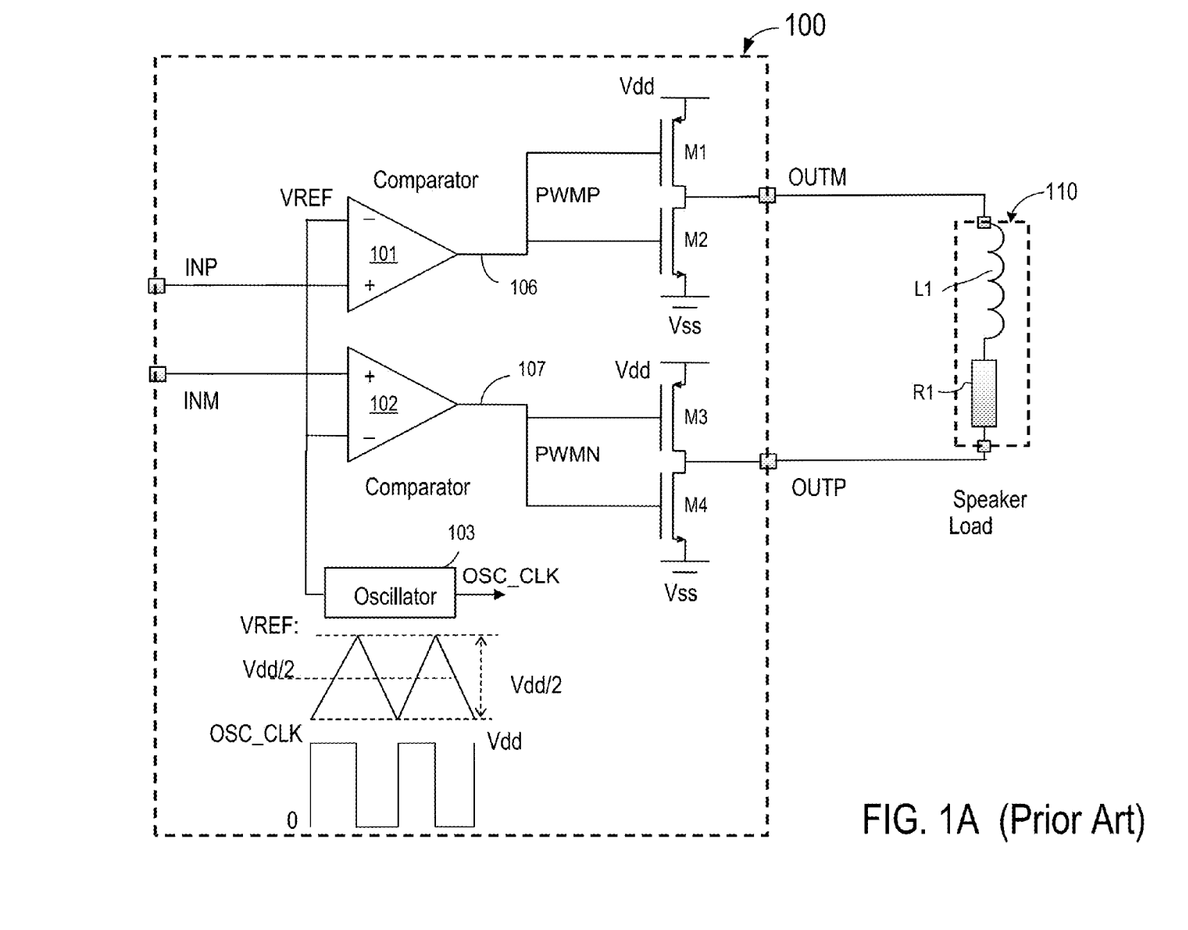
FIG. 1A shows a simplified schematic diagram illustrating a conventional class-D amplifier.

FIG. 1A shows a simplified schematic diagram illustrating a conventional class-D amplifier 100. As shown, amplifier 100 includes two comparators 101 and 102. Amplifier 100 also includes an oscillator 103, which outputs a clock signal OSC_CLK and a triangular wave signal VREF. The waveforms for clock signal OSC_CLK and triangular wave signal VREF are shown in FIG. 1A as inserts below the block diagram for oscillator 103. Differential input audio signals INP and INM are input to comparators 101 and 102, where input signals INP and INM are compared with triangular wave signal VREF to generate PWM signals 106 and 107. PWM signals 106 and 107 are coupled to the gates of transistors M1, M2, M3, and M4, respectively. Differential output signals OUTM and OUTP of the class D amplifier are respectively provided at terminals also labeled OUTM and OUTP. As shown in FIG. 1, output signals OUTM and OUTP are connected to a speaker load 110, which is represented schematically by an inductor L1 and a resistor R1.

Figure 1B:
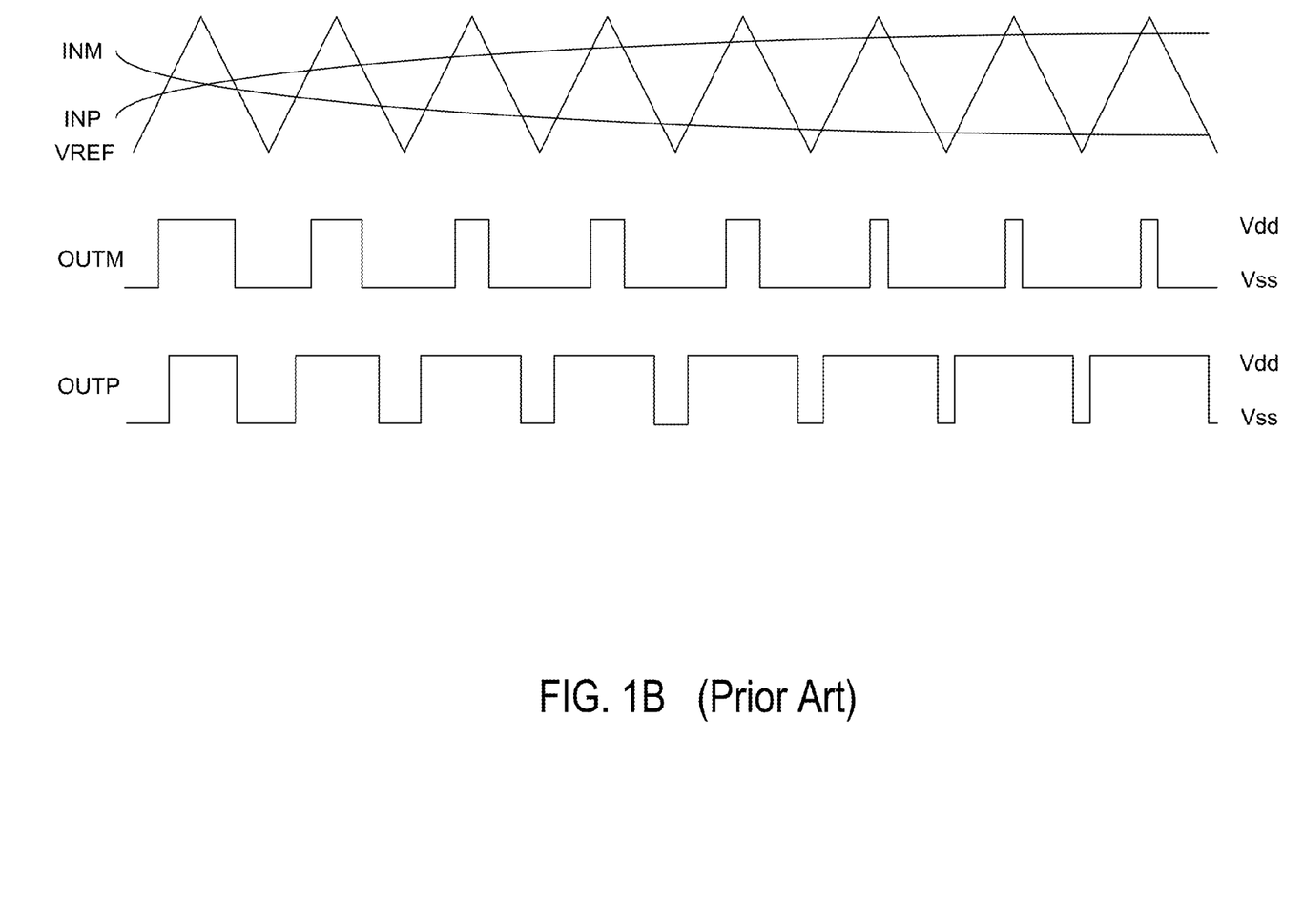
FIG. 1B is a waveform diagram illustrating various signal waveforms in a conventional class-D amplifier.

Traditional class D amplifiers have differential outputs (OUTP and OUTM) wherein each output is complementary and has a swing range from ground Vss to Vdd. FIG. 1B is a waveform diagram illustrating the modulation of signals in the class-D amplifier of FIG. 1. As shown in the top diagram FIG. 1B, differential input signals, e.g., audio signals INM and INP, are compared with a triangular reference waveform VREF by two comparators as described above in connection with FIG. 1. The output signals of the comparators are pulse signals at a fixed frequency whose pulse width is proportional to the input signal. Two PWM signals are shown in FIG. 1B as OUTP and OUTM.

Filter-less Class-D Audio amplifiers, such as amplifier 100 of FIG. 1, employ a modulation scheme often referred to as BD-modulation. In this modulation scheme the output drivers, connected in bridge tied load configuration, switch the positive and negative side of the load to: 1) Vdd & GND; 2) GND & Vdd; 3) Vdd & Vdd; 4) GND & GND, where Vdd is the supply voltage and GND is the supply ground. As a result, the differential voltage across the load has three levels: 1) Vdd; 2) −Vdd; 3) 0. For 0 level audio output voltages the differential voltage across the load will be predominantly zero, allowing filter-less operation through an inductive speaker load.

BD modulating class-D amplifiers are sometimes referred to as "filter-free" because no LC filter is required to improve small signal efficiency. A problem with class-D amplifiers is caused by clipping. Such conditions can occur, for example, when input signals exceed the proper range for the class-D amplifier. Clipping is undesirable for many reason, for example, it can cause signal distortion and cause undue stress on the speaker system. More details on signal clipping are described in the sections below.

From the above, it is clear that an improved method improving class-D amplifiers is highly desirable.

BRIEF SUMMARY OF THE INVENTION

The present invention generally relates to audio systems. More particularly, the present invention provides a method and system for detecting signal clipping in an audio system by a simple detection circuit using only available internal signals in the system. Merely by way of example, the present invention has been applied to clip detection in filter-less class-D audio amplifiers, but it would be recognized that the invention has a much broader range of applications.

According to an embodiment of the invention, an integrated circuit (IC) chip having a class D amplifier for filter-less application includes an oscillator clock signal having a rising edge and a falling edge in each oscillator clock cycle, a reference ramp voltage generator for generating a reference ramp voltage from the oscillator clock signal, and a class-D PWM (pulse width modulation) modulator. The class-D PWM modulator is configured for generating first and second PWM signals in each oscillator clock cycle by comparing first and second complementary input signals with the reference ramp voltage. The first and the second PWM signals are in a first state when the corresponding input signal is higher than the reference ramp voltage, and the first and the second PWM signals are in a second state when the corresponding input signal is lower than the reference ramp voltage. The class-D PWM modulator further includes a clipping detection circuit configured to turn on a clipping indication signal when one or both of the first PWM signal and the second PWM signal maintain the same state at two consecutive edges of the oscillator clock signal. The clipping detection circuit is configured to turn off the clipping indication signal when both the first PWM signal and the second PWM signal change states at two consecutive edges of the oscillator clock signal.

In an embodiment of the integrated circuit chip, the clipping detection circuit is configured to turn on a clipping indication signal when one or both of the first and second complementary input signals are outside the magnitude range the reference ramp voltage. In an embodiment, the clipping detection circuit includes first and second edge-triggered flip-flops coupled to the first PWM signal and triggered by the oscillator clock signal and complementary oscillator clock signal, respectively, and a first EXCLUSIVE NOR circuit for receiving the outputs of the first and the second edge-triggered flip-flops and for providing a first clipping signal. The clipping detection circuit also includes third and fourth edge-triggered flip-flops coupled to the second PWM signal and driving by the oscillator clock signal and complementary oscillator clock signal, respectively, and a second EXCLUSIVE NOR circuit for receiving the outputs of the third and the fourth edge-triggered flip-flops and for providing a second clipping signal. The clipping detection circuit also includes an OR circuit for receiving the first and the second clipping signals from the first and the second EXCLUSIVE NOR circuit. Each of the EXCLUSIVE NOR circuits is configured to provide a low output signal when two input logic signals are different from each other, and is configured to provide a high output signal when two input logic signals are the same.

In an embodiment of the above integrated circuit chip, the class-D PWM (pulse width modulation) modulator includes a first comparator circuit for receiving the first differential input signal and the reference ramp voltage and generating the first PWM signal, and a second comparator circuit for receiving the second differential input signal and the reference ramp voltage and generating the second PWM signal. In a specific embodiment, the first and the second output signals are configured for coupling to a speaker without a filter. In an embodiment, the differential output driver includes first and second amplifier circuits, each of which has a PMOS transistor and an NMOS transistor coupled in series.

According to another embodiment, an integrated circuit (IC) chip includes one or more input pins for receiving one or more input signals, an oscillator clock signal having a rising edge and a falling edge in each oscillator clock cycle, and a first signal processing circuit coupled to the one or more input signals and configured for providing one or more PWM (pulse width modulation) signals in each oscillator clock cycle. The IC chip also includes a clipping detection circuit configured to turn on a clipping indication signal when one or more of the PWM signals maintain the same state between two consecutive edges of the oscillator clock signal. The clipping detection circuit is configured to turn off the clipping indication signal when all of the one or more PWM signals change states between two consecutive edges of the oscillator clock signal.

In an embodiment of the above IC chip the clipping detection circuit is configured to turn on a clipping indication signal when one or more of the input signals are outside the magnitude range the reference ramp voltage. In an embodiment, the reference ramp signal is derived from an oscillator clock signal. Each of the PWM signals is in a first state when the corresponding input signal is higher than the reference ramp voltage, and each of the PWM signals is in a second state when the corresponding input signal is lower than the reference ramp voltage.

According to another embodiment of the invention, an integrated circuit (IC) chip having a class D amplifier includes an oscillator clock signal having a rising edge and a falling edge in each oscillator clock cycle and a reference ramp voltage generator for generating a reference ramp voltage from the oscillator clock signal. A class-D PWM (pulse width modulation) modulator is configured for generating first and second PWM signals in each oscillator clock cycle by comparing first and second complementary input signals with the reference ramp voltage. A clipping detection circuit is configured to turn on a clipping indication signal when one or both of the first and second complementary input signals are outside the magnitude range the reference ramp voltage, and the clipping detection circuit is configured to turn off the clipping indication signal when both of the first and second complementary input signals are within the magnitude range the reference ramp voltage.

According to an alternative embodiment, an audio system includes a class-D amplifier and a speaker for receiving the output signals from the class-D amplifier. The class D amplifier includes an oscillator clock signal having a rising edge and a falling edge in each clock cycle, a reference ramp voltage generator for generating a reference ramp voltage from the oscillator clock signal, and a class-D PWM (pulse width modulation) modulator. The class-D PWM modulator is configured for generating first and second PWM signals in each oscillator clock cycle by comparing first and second complementary input signals with the reference ramp voltage. The first and the second PWM signals are in a first state when the corresponding input signal is higher than the reference ramp voltage, and the first and the second PWM signals are in a second state when the corresponding input signal is lower than the reference ramp voltage. The class-D PWM modulator also includes a differential output driver configured for driving a first and a second output signals in response to the first and the second PWM signals. The class-D PWM modulator further includes a clipping detection circuit configured to turn on a clipping indication signal when one or both of the first PWM signal and the second PWM signal maintain the same state between two consecutive edges of the oscillator clock signal. The clipping detection circuit is configured to turn off the clipping indication signal when both the first PWM signal and the second PWM signal change states between two consecutive edges of the oscillator clock signal.

A further understanding of the nature and advantages of the present invention may be realized by reference to the remaining portions of the specification and the drawings.

DETAILED DESCRIPTION OF THE INVENTION

As described above, signal clipping is undesirable in an audio amplifier. In FIGS. 1A and 1B, class-D amplifier 100 operates between between 0V and Vdd. Depending on the application, Vdd could be 3V or another appropriate voltage, for example. Clock signal OSC_CLK and triangular or ramp wave signal VREF both vary in amplitude between 0V and Vdd. Input terminals INP and INM receive differential signals that also vary between 0V and Vdd. Under certain conditions, voltage supply Vdd to class-D amplifier 100 could become lower causing clock signal OSC_CLK and triangular wave signal VREF to drop below Vdd. As a result, input signals INP and INM can become higher than VDD, which leads to signal clipping. An example of clipping is illustrated in FIG. 2.

Figure 2:
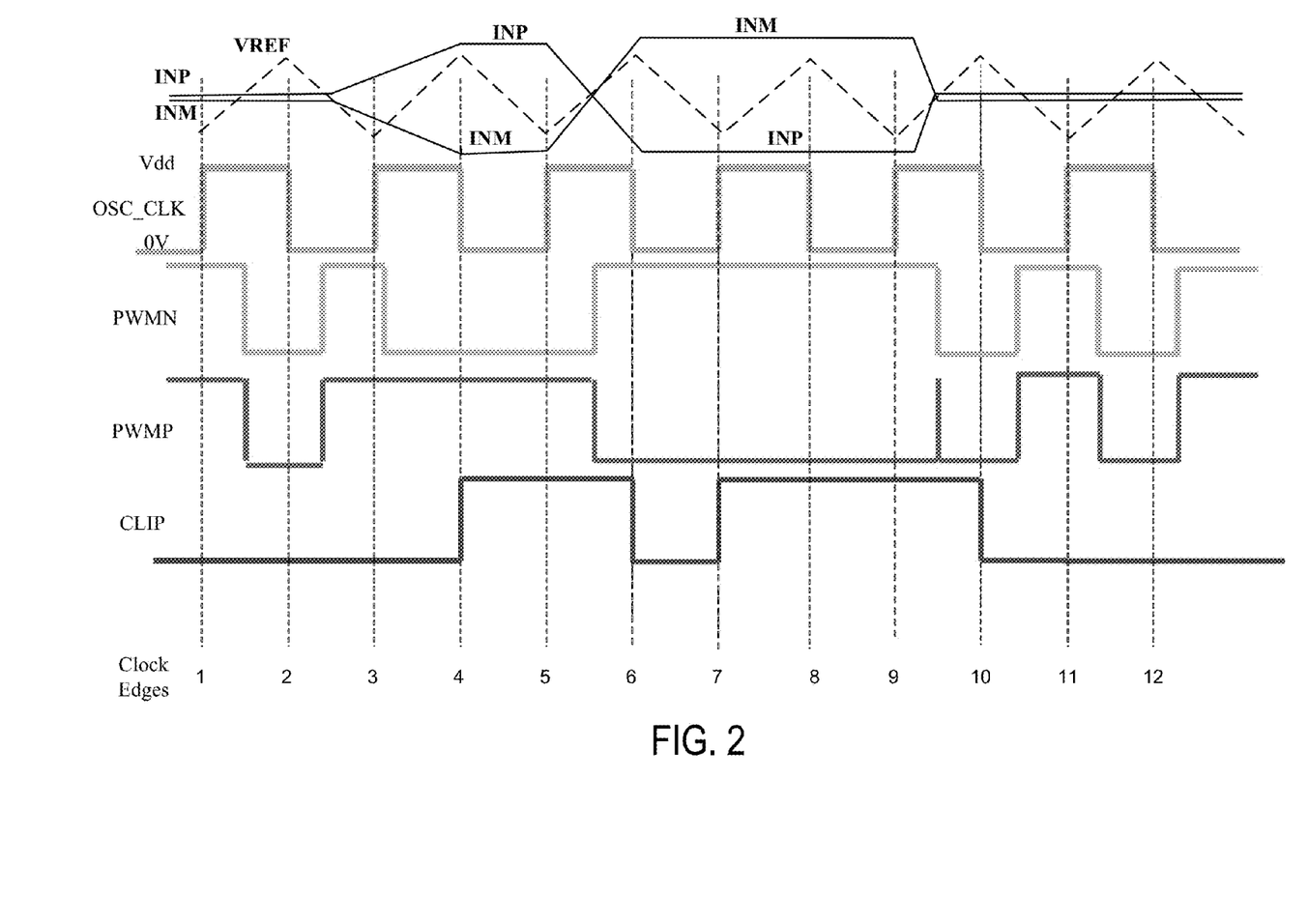
FIG. 2 is a waveform diagram illustrating various signal waveforms in a class-D amplifier according to embodiments of the invention.
Figure 3A:
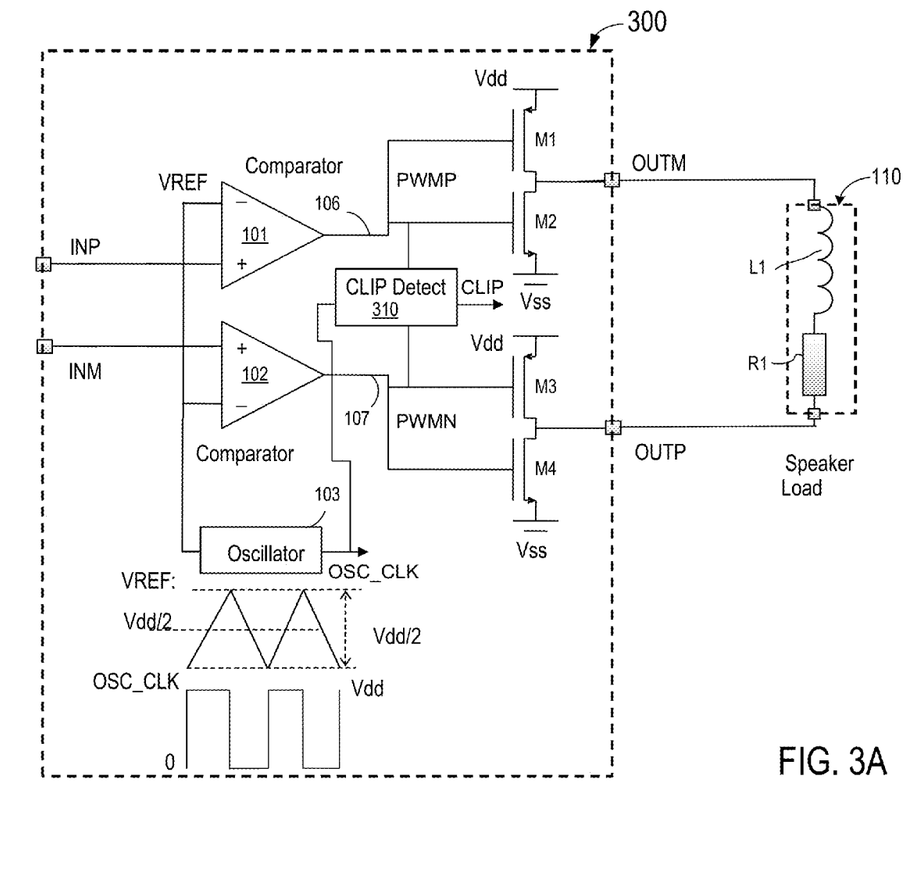
FIG. 3A a simplified schematic diagram illustrating an audio system including a class-D amplifier according to an embodiment of the present invention.
Figure 3B:
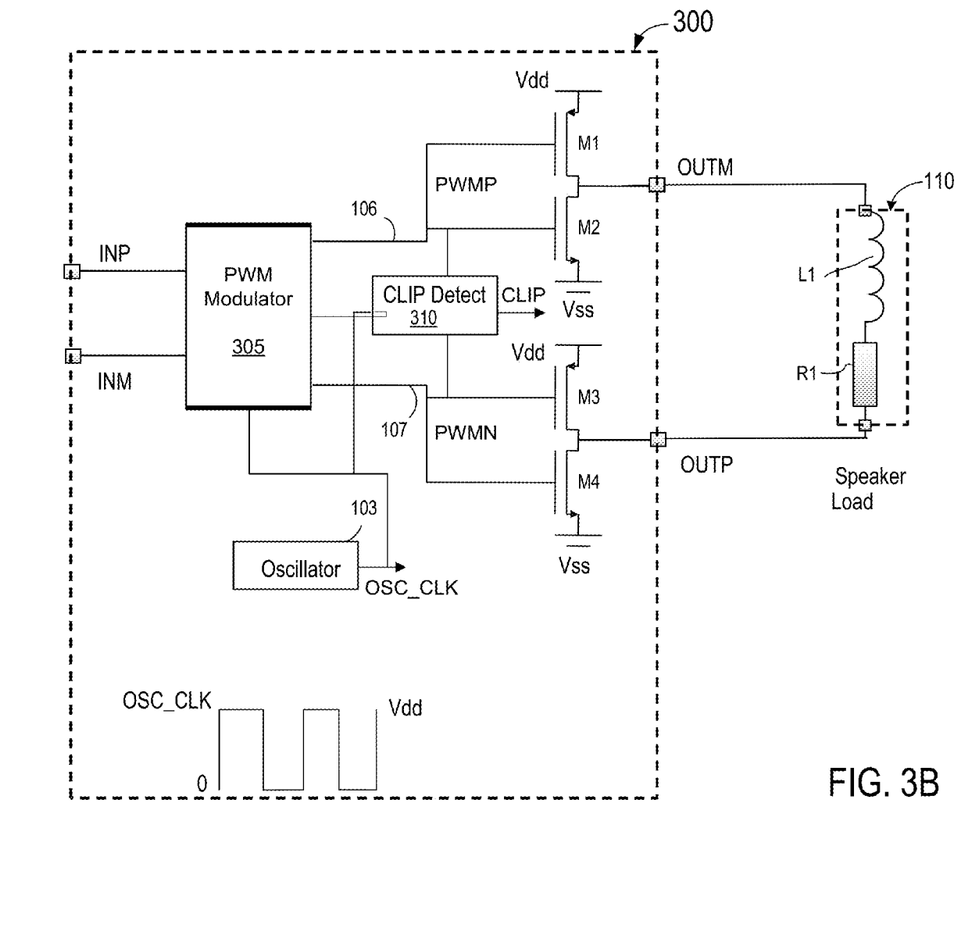
FIG. 3B a simplified schematic diagram illustrating an audio system including a class-D amplifier according to an alternative embodiment of the present invention.
Figure 4:
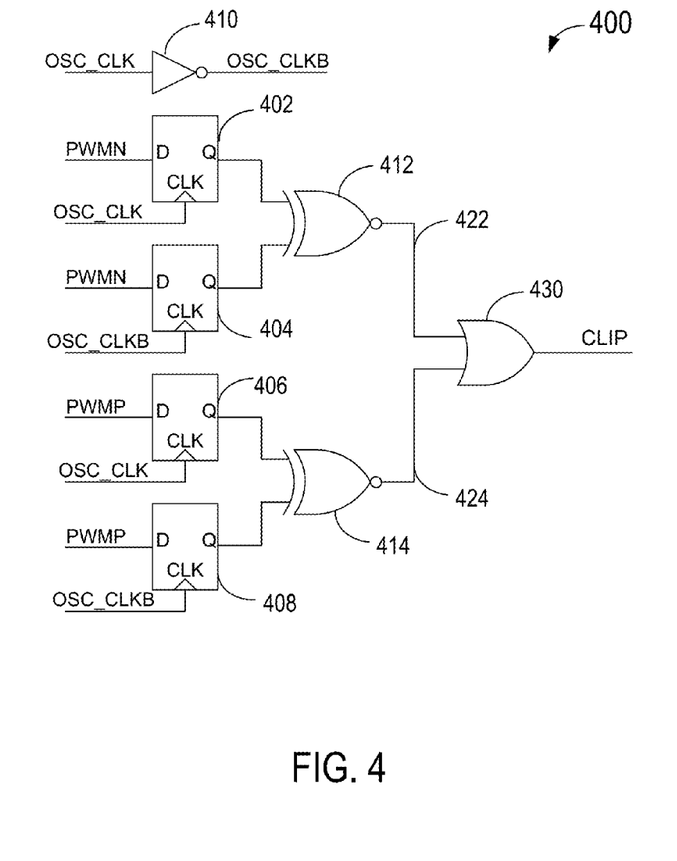
FIG. 4 is a circuit diagram illustrating a circuit 400 according to an embodiment of the invention for implementing a clipping detection method.

FIG. 2 is a waveform diagram illustrating various signals in a class-D amplifier according to embodiments of the invention to be described in a subsequent section with reference to FIGS. 3A, 3B, and 4. As shown in FIG. 2, clock signal OSC_CLK oscillates between 0V and Vdd at a fixed clock frequency. Each clock pulse has a rising edge and a falling edge, and the clock edges are numbered at the bottom of FIG. 2 for easy reference. Similarly, similarly triangular wave or ramp wave signal VREF, which is related from clock signal OSC_CLK, also oscillates between 0V and Vdd at the fixed clock frequency. Superimposed over the VREF signal are the input signals INP and INM. FIG. 2 also illustrates the generation of PWM signals PWMN and PWMP. For example, when input signal INM is higher than VREF, PWMN is high, and when input signal INM is lower than VREF, PWMN is low. Similarly, when input signal INP is higher than VREF, PWMP is high, and when input signal INP is lower than VREF, PWMP is low. It can be seen that OSC_CLK, PWMN, and PWMP are all logic signals having two states, a high state and a low state. In the description herein, these states are sometimes referred to as first state and second state, or "1" state and "0" state, and either one can be the high state or the low state.

It can be seen in FIG. 2 that at clock edges #4 and #5, input signals INP and INM exceed the magnitude ranges of VREF, which is referred to as a signal clipping condition. Similar clipping conditions can be seen at clock edges #6-#9. Audio signal clipping is undesirable, because it can cause distortion and loss of signal fidelity. Signal clipping can lead to prolonged periods of PWMN and PWMP staying in the same state. Such a condition can also cause undue stress on the speaker and can cause damage to the speaker. Therefore, it is desirable to be able to efficiently and effectively detect signal clipping conditions to allow the system to take appropriate actions. As described below, embodiments of the invention provide methods and circuits for detecting signal clipping.

FIG. 3A includes a simplified schematic diagram illustrating a class-D amplifier 300 with a clip detection circuit according to an embodiment of the present invention. Amplifier 300 has many similar components as amplifier 100 of FIG. 1, and these components are marked with the same numerals as in FIG. 1. As shown, amplifier 300 includes two comparators 101 and 102. Amplifier 300 also includes an oscillator 103, which outputs a clock signal OSC_CLK and a triangular wave signal VREF. The waveforms for clock signal OSC_CLK and triangular wave signal VREF are shown above in FIG. 2 as inserts below the block diagram for oscillator 103. Two differential input audio signals INP and INM are input to comparators 101 and 102, where input signals INP and INM are compared with triangular wave signal (also referred to as ramp reference signal) VREF to generate PWM signals 106 and 107. PWM signals 106 and 107 are coupled to the gates of transistors M1, M2, M3, and M4, which form the output drivers. Differential output signals OUTM and OUTP of the class D amplifier are respectively provided at terminals also labeled OUTM and OUTP. As shown in FIG. 3A, output signals OUTM and OUTP are connected to a speaker load 110, which is represented schematically by an inductor L1 and a resistor R1.

As shown in FIG. 3A, amplifier 300 also includes a clip detection circuit 310, which determines a clipping condition with a simple circuit using signals that already exist in the conventional class-D amplifier. In FIG. 3A, clip detection circuit 310 receives clock signal OSC_CLK and PWM signals PWMN and PWMP. Clip detection circuit 310 is configured to produce a clip detection signal CLIP when a signal clipping is detected.

An embodiment of the invention provides a method for detecting signal clipping which is now explained with reference to the signal waveforms in FIG. 2. As described above, signal clipping conditions occur at clock edges #4 and #5, and at clock edges #6 to #9. At these clock edges, input signals INP and/or INM exceed the magnitude ranges of VREF. It is recognized in embodiments of the invention that the signal clipping conditions can be determined by examining, at clock edges of the oscillator clock edges, PWM signals PWNN and PWMP (which are referred to as the first PWM signal and the second PWM signal, or vice versa).

In some embodiments, clipping detection circuit 310 is configured to turn on a clipping indication signal when one or both of the first PWM signal and the second PWM signal maintain the same state between two consecutive edges of the oscillator clock signal, and wherein the clipping detection circuit is configured to turn off the clipping indication signal when both the first PWM signal and the second PWM signal change states between two consecutive edges of the oscillator clock signal.

Note that the method described above determines a clipping condition by examining PWM signals, but does not depend on how the PWM signals are generated. As an example, FIG. 3A illustrates an integrated circuit in which the PWM signal is generated by comparing input signals with a ramp reference signal. As another example, FIG. 3B illustrates an integrated circuit in which the PWM signals can be generated by other means in alternative embodiments of the invention. As shown in the schematic diagram of FIG. 3B and signal waveforms in FIG. 2, an integrated circuit (IC) chip 300 includes one or more input pins (e.g., INP and INM) for receiving one or more input signals and an oscillator 103 for generating an oscillator clock signal OSC_CLK having a rising edge and a falling edge in each oscillator clock cycle. A first signal processing circuit 305 is coupled to the one or more input signals (INP and INM) and configured for providing one or more PWM (pulse width modulation) signals 106 and 107 (PWMP and PWMN) in each oscillator clock cycle. Here, signal processing circuit 305 is a PWM modulator, which can generate PWM signals by either analog or digital methods. A clipping detection circuit 310 is configured to turn on a clipping indication signal when one or more of the PWM signals maintain the same state between two consecutive edges of the oscillator clock signal, and wherein the clipping detection circuit is configured to turn off the clipping indication signal when all of the one or more PWM signals and the change states between two consecutive edges of the oscillator clock signal. In a specific embodiment in which the PWM signals are generated using a reference ramp voltages, the clipping detection circuit is configured to turn on a clipping indication signal when one or more of the input signals are outside the magnitude range a reference ramp voltage used for generating the PWM signals. In this embodiment, the condition of whether one or more of the input signals are outside the magnitude range a reference ramp voltage is detected by examining the PWM signals as described above and further illustrated with reference to FIG. 2.

In FIG. 2, between clock edges #1 and #2, both PWMN and PWMP change states, i.e., from a high state and a low state. As a result, clip detection signal CLIP is low. Between clock edges #3 and #4, both PWMN changes states, i.e., from a high state and a low state, but PWNP stayed at the high states between clock edges #3 and #4. Therefore, clip detection signal CLIP becomes high at clock edge #4. An example of a clip detection circuit for implementing the above method is described below with reference to FIG. 4.

FIG. 4 is a circuit diagram illustrating a clip detection circuit 400 according to an embodiment of the invention for implementing the clipping detection circuit 310 of FIG. 3. In FIG. 4, clipping detection circuit 400 includes first and second edge-triggered flip-flops, also referred to as latches, 402 and 404, coupled to the first complementary input signal (e.g., PWMN) and driven by the oscillator clock signal OSC_CLK and complementary oscillator clock signal OSC_CLKB, respectively. Flip-flop 402 latches PWMN at the rising edge of the clock when the ramp signal VREF is going up, and flip-flop 404 latches PWMN at the falling edge of the clock when the ramp signal VREF is going down. Clipping detection circuit 400 also includes a first EXCLUSIVE NOR circuit 412 for receiving the outputs of the first and the second edge-triggered flip-flops (402 and 404) and for providing a first clipping signal 422. EXCLUSIVE NOR circuit 412 is configured to provide a "0" or low output signal when two input logic signals are different from each other, and is configured to provide a "1" or high output signal when two input logic signals are the same. Therefore, the first clipping signal 422 is a "1" when PWMN remains unchanged at two consecutive clock edge signals, either rising edge followed by a falling edge or vice versa, which indicates a clipping condition for PWMN.

A clipping condition for PWMP is detected in a similar fashion. Clipping detection circuit 400 also includes third and fourth edge-triggered flip-flops, 402 and 404, coupled to the second complementary input signal PWNP and driven by the oscillator clock signal OSC_CLK and complementary oscillator clock signal OSC_CLKB, respectively. A second EXCLUSIVE NOR circuit 424 is configured for receiving the outputs of the third and the fourth edge-triggered flip-flops (406 and 408) and for providing a second clipping signal 424.

As shown in FIG. 4, an OR circuit 430 is configured for receiving the first and the second clipping signals, 422 and 424, from the first and the second EXCLUSIVE NOR circuits, 412 and 414, respectively. The output of OR circuit 430 is the clipping detection signal CLIP. A "1" or high state of CLIP indicates that a clip is detected in either or both of PWMN and PWMP. And a "0" or low state of CLIP indicates that no clipping is detected.

As described above, embodiments of the present invention provide a method and an exemplary circuit implementation for detecting signal clipping in a class-D amplifier. The method and circuit use internal PWM signals and a oscillator clock signal to generate a clipping detection signal with little additional circuitry. The method is simple and cost-effective compared with conventional techniques. An example of a conventional audio detection and handling technique is described in U.S. Pat. No. 5,453,716 to Andrews, et al., which is incorporated herein by reference. Andrew's method involves analyzing output audio waveforms and using a fixed level to detect clipping. Such approach is not only complex, but also requires extensive additional circuitry.

According to another embodiment, the above method can be implemented in an integrated circuit (IC) chip for handling more than two input signals. The IC chip includes one or more input pins for receiving one or more input signals, and a first signal processing circuit coupled to the one or more input signals and configured for providing one or more PWM (pulse width modulation) signals based on comparison of the one or more input signals with a reference ramp voltage signal. The IC chip also includes a clipping detection circuit configured to turn on a clipping indication signal when one or more of the PWM signals maintain the same state between two consecutive edges of the oscillator clock signal. The clipping detection circuit is configured to turn off the clipping indication signal when all of the one or more PWM signals and the change states between two consecutive edges of the oscillator clock signal.

In an embodiment of the above IC chip the clipping detection circuit is configured to turn on a clipping indication signal when one or more of the input signals are outside the magnitude range the reference ramp voltage. In an embodiment, the reference ramp signal is derived from a oscillator clock signal. Each of the PWM signals is in a first state when the corresponding input signal is higher than the reference ramp voltage, and each of the PWM signals is in a second state when the corresponding input signal is lower than the reference ramp voltage.

In an embodiment of the above IC chip, the clipping detection circuit includes a clipping signal generator for each of the input signals. Each clipping signal generator includes first and second edge-triggered flip-flops coupled to the first complementary input signal and driving by the oscillator clock signal and complementary oscillator clock signal, respectively, and an EXCLUSIVE NOR circuit for receiving the outputs of the first and second edge-triggered flip-flops. The clipping detection circuit further comprises an OR circuit for receiving an output from each of the clipping signal generator.

According to other embodiment of the invention, an audio system as illustrated in FIG. 3 includes a class-D amplifier 300 for providing a first and a second output signal OUTM and OUTP to a speaker 110. Speaker load 110 is represented by an inductor L1 and a resistor R1. The circuit and function of class D amplifier 300 are described above with reference to FIGS. 2-4. The class-D amplifier includes an oscillator clock signal having a rising edge and a falling edge in each clock cycle, a reference ramp voltage generator for generating a reference ramp voltage from the oscillator clock signal, and a class-D PWM (pulse width modulation) modulator. The class-D PWM modulator is configured for generating first and second PWM signals by comparing first and second complementary input signals with the reference ramp voltage. The first and the second PWM signals are in a first state when the corresponding input signal is higher than the reference ramp voltage, and the first and the second PWM signals are in a second state when the corresponding input signal is lower than the reference ramp voltage. The class-D PWM modulator also includes a differential output driver configured for driving a first and a second output signals in response to the first and the second PWM signals. The class-D PWM modulator further includes a clipping detection circuit configured to turn on a clipping indication signal when one or both of the first PWM signal and the second PWM signal maintain the same state between two consecutive edges of the oscillator clock signal. The clipping detection circuit is configured to turn off the clipping indication signal when both the first PWM signal and the second PWM signal change states between two consecutive edges of the oscillator clock signal.

In an embodiment of the integrated circuit chip, the clipping detection circuit is configured to turn on a clipping indication signal when one or both of the first and second complementary input signals are outside the magnitude range the reference ramp voltage. In an embodiment, the clipping detection circuit includes first and second edge-triggered flip-flops coupled to the first complementary input signal and driving by the oscillator clock signal and complementary oscillator clock signal, respectively, and a first EXCLUSIVE NOR circuit for receiving the outputs of the first and the second edge-triggered flip-flops and for providing a first clipping signal. The clipping detection circuit also includes third and fourth edge-triggered flip-flops coupled to the second complementary input signal and driving by the oscillator clock signal and complementary oscillator clock signal, respectively, and a second EXCLUSIVE NOR circuit for receiving the outputs of the third and the fourth edge-triggered flip-flops and for providing a second clipping signal. The clipping detection circuit also includes an OR circuit for receiving the first and the second clipping signals from the first and the second EXCLUSIVE NOR circuit. Each of the EXCLUSIVE OR circuits is configured to provide a low output signal when two input logic signals are different from each other, and is configured to provide a high output signal when two input logic signals are the same.

In an embodiment of the above integrated circuit chip, the class-D PWM (pulse width modulation) modulator includes a first comparator circuit for receiving the first differential input signal and the reference ramp voltage and generating the first PWM signal, and a second comparator circuit for receiving the second differential input signal and the reference ramp voltage and generating the second PWM signal. In a specific embodiment, the first and the second output signals are configured for coupling to a speaker without a filter. In an embodiment, the differential output driver comprises first and second amplifier circuits, each of which includes a PMOS transistor and an NMOS transistor coupled in series.

The audio system described above can use the clip detection signal CLIP, as shown in FIGS. 3 and 4, to take appropriate actions. For example, if it is desirable to reduce distortion, the audio system can reduce the output audio signals. Alternatively, the audio system can reduce the received audio input signals such as the signal clipping is decreased or eliminated.

As shown above, the invention is described above using specific examples. But it is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit (IC) chip having a class D amplifier for filter-less application, comprising:
    an oscillator clock signal having a rising edge and a falling edge in each oscillator clock cycle;
    a reference ramp voltage generator for generating a reference ramp voltage from the oscillator clock signal;
    a class-D PWM (pulse width modulation) modulator configured for generating first and second PWM signals in each oscillator clock cycle by comparing first and second complementary input signals with the reference ramp voltage, wherein the first and the second PWM signals are in a first state when the corresponding input signal is higher than the reference ramp voltage, and the first and the second PWM signals are in a second state when the corresponding input signal is lower than the reference ramp voltage; and
    a clipping detection circuit configured to turn on a clipping indication signal when one or both of the first PWM signal and the second PWM signal maintain the same state between two consecutive edges of the oscillator clock signal, and wherein the clipping detection circuit is configured to turn off the clipping indication signal when both the first PWM signal and the second PWM signal change states between two consecutive edges of the oscillator clock signal.

2. The integrated circuit chip of claim 1, wherein the clipping detection circuit is configured to turn on a clipping indication signal when one or both of the first and second complementary input signals are outside the magnitude range the reference ramp voltage.

3. The integrated circuit chip of claim 1, wherein the clipping detection circuit comprises:
    first and second edge-triggered flip-flops coupled to the first PWM signal and triggered by the oscillator clock signal and complementary oscillator clock signal, respectively;
    a first EXCLUSIVE NOR circuit for receiving the outputs of the first and the second edge-triggered flip-flops and for providing a first clipping signal;
    third and fourth edge-triggered flip-flops coupled to the second PWM signal and driving by the oscillator clock signal and complementary oscillator clock signal, respectively;
    a second EXCLUSIVE NOR circuit for receiving the outputs of the third and the fourth edge-triggered flip-flops and for providing a second clipping signal; and
    an OR circuit for receiving the first and the second clipping signals from the first and the second EXCLUSIVE NOR circuits
    wherein each of the EXCLUSIVE NOR circuits is configured to provide a low output signal when two input logic signals are different from each other, and is configured to provide a high output signal when two input logic signals are the same.

4. The integrated circuit chip of claim 1, wherein the class-D PWM (pulse width modulation) modulator comprises:
    a first comparator circuit for receiving the first differential input signal and the reference ramp voltage and generating the first PWM signal; and
    a second comparator circuit for receiving the second differential input signal and the reference ramp voltage and generating the second PWM signal.

5. The integrated circuit chip of claim 1, wherein the first and the second output signals are configured for coupling to a speaker without a filter.

6. The integrated circuit chip of claim 1, wherein the differential output driver comprises first and second amplifier circuits, each of which includes a PMOS transistor and an NMOS transistor coupled in series.

7. An integrated circuit (IC) chip, comprising:
    one or more input pins for receiving one or more input signals;
    an oscillator clock signal having a rising edge and a falling edge in each oscillator clock cycle;
    a first signal processing circuit coupled to the one or more input signals and configured for providing one or more PWM (pulse width modulation) signals in each oscillator clock cycle; and
    a clipping detection circuit configured to turn on a clipping indication signal when one or more of the PWM signals maintain the same state between two consecutive edges of the oscillator clock signal, and wherein the clipping detection circuit is configured to turn off the clipping indication signal when all of the one or more PWM signals change states between two consecutive edges of the oscillator clock signal;

wherein the clipping detection circuit is configured to turn on a clipping indication signal when one or more of the input signals are outside the magnitude range a reference ramp voltage used for generating the PWM signals;

wherein the reference ramp signal is derived from a oscillator clock signal, and wherein each of the PWM signals is in a first state when the corresponding input signal is higher than the reference ramp voltage, and each of the PWM signals is in a second state when the corresponding input signal is lower than the reference ramp voltage.

8. The integrated circuit chip of claim 7, wherein the clipping detection circuit comprises a clipping signal generator for each of the PWM signals, wherein each clipping signal generator includes:
   first and second edge-triggered flip-flops coupled to the first PWM signal and driving by the oscillator clock signal and complementary oscillator clock signal, respectively; and
   an EXCLUSIVE NOR circuit for receiving the outputs of the first and second edge-triggered flip-flops;
   wherein the clipping detection circuit further comprises an OR circuit for receiving an output from each of the clipping signal generator.

9. An integrated circuit (IC) chip having a class D amplifier for filter-less application, comprising:
   an oscillator clock signal having a rising edge and a falling edge in each oscillator clock cycle;
   a reference ramp voltage generator for generating a reference ramp voltage from the oscillator clock signal;
   a class-D PWM (pulse width modulation) modulator configured for generating first and second PWM signals in each oscillator clock cycle by comparing first and second complementary input signals with the reference ramp voltage; and
   a clipping detection circuit configured to turn on a clipping indication signal when one or both of the first and second complementary input signals are outside the magnitude range of the reference ramp voltage, and wherein the clipping detection circuit is configured to turn off the clipping indication signal when both of the first and second complementary input signals are within the magnitude range of the reference ramp voltage.

10. An audio system, comprising:
   a speaker for receiving a first and a second output signals; and
   a class-D amplifier,
   wherein the class-D amplifier comprising:
   an oscillator clock signal having a rising edge and a falling edge in each oscillator clock cycle;
   a reference ramp voltage generator for generating a reference ramp voltage from the oscillator clock signal;
   a class-D PWM (pulse width modulation) modulator configured for generating first and second PWM signals by comparing first and second complementary input signals with the reference ramp voltage, wherein the first and the second PWM signals are in a first state when the corresponding input signal is higher than the reference ramp voltage, and the first and the second PWM signals are in a second state when the corresponding input signal is lower than the reference ramp voltage; and
   a clipping detection circuit configured to turn on a clipping indication signal when one or both of the first PWM signal and the second PWM signal maintain the same state between two consecutive edges of the oscillator clock signal, and wherein the clipping detection circuit is configured to turn off the clipping indication signal when both the first PWM signal and the second PWM signal change states between two consecutive edges of the oscillator clock signal.

11. The audio system of claim 10, wherein the clipping detection circuit is configured to turn on a clipping indication signal when one or both of the first and second complementary input signals are outside the magnitude range the reference ramp voltage.

12. The audio system of claim 10, wherein the clipping detection circuit comprises:
   first and second edge-triggered flip-flops coupled to the first PWM signal and driving by the oscillator clock signal and complementary oscillator clock signal, respectively;
   a first EXCLUSIVE NOR circuit for receiving the outputs of the first and second edge-triggered flip-flops;
   third and fourth edge-triggered flip-flops coupled to the second PWM signal and driving by the oscillator clock signal and complementary oscillator clock signal, respectively;
   a second EXCLUSIVE NOR circuit for receiving the outputs of the third and fourth edge-triggered flip-flops; and
   an OR circuit for receiving outputs from the first and the second EXCLUSIVE NOR circuits.

13. The audio system of claim 12, wherein the class-D PWM (pulse width modulation) modulator comprises:
   a first comparator circuit for receiving the first differential input signal and the reference ramp voltage and generating the first PWM signal; and
   a second comparator circuit for receiving the second differential input signal and the reference ramp voltage and generating the second PWM signal.

14. The audio system of claim 10, wherein the first and the second output signals are configured for coupling to the speaker without a filter.

15. The audio system of claim 10, wherein the differential output driver comprises first and second amplifier circuits, each of which includes a PMOS transistor and an NMOS transistor coupled in series.

16. The audio system of claim 10, wherein the class D amplifier is included in an integrated circuit (IC) chip, and each of the terminals is coupled to a pin of the IC.

* * * * *